United States Patent
Al-Rawhani et al.

(10) Patent No.: US 11,162,839 B2
(45) Date of Patent: Nov. 2, 2021

(54) PHOTODETECTION CIRCUIT WITH EXTENDED HOLD-OFF TIME FOR SPAD QUENCH ASSISTANCE

(71) Applicant: STMicroelectronics (Research & Development) Limited, Marlow (GB)

(72) Inventors: Mohammed Al-Rawhani, Glasgow (GB); Bruce Rae, Edinburgh (GB)

(73) Assignee: STMicroelectronics (Research & Development) Limited, Marlow (GB)

( * ) Notice: Subject to any disclaimer, the term of this patent is extended or adjusted under 35 U.S.C. 154(b) by 0 days.

(21) Appl. No.: 17/071,326

(22) Filed: Oct. 15, 2020

(65) Prior Publication Data

US 2021/0181017 A1    Jun. 17, 2021

Related U.S. Application Data (63) Continuation-in-part of application No. 16/711,832, filed on Dec. 12, 2019.

(51) Int. Cl.
*G01J 1/44* (2006.01)
*H03K 3/037* (2006.01)

(52) U.S. Cl.
CPC ......... *G01J 1/44* (2013.01); *G01J 2001/4466* (2013.01); *H03K 3/037* (2013.01)

(58) Field of Classification Search
CPC ............... G01J 1/44; G01J 2001/4466; G01J 2001/442; H03K 3/037
USPC ........................................ 250/214 R, 214.1
See application file for complete search history.

(56) References Cited

U.S. PATENT DOCUMENTS

| | | | | |
|---|---|---|---|---|
| 4,963,727 | A | * | 10/1990 | Cova .................. G01J 1/44 250/214 R |
| 8,188,563 | B2 | | 5/2012 | Finkelstein et al. |
| 9,024,246 | B2 | | 5/2015 | Jiang et al. |
| 10,852,399 | B2 | | 12/2020 | Fenigstein et al. |

(Continued)

FOREIGN PATENT DOCUMENTS

CN        103148950 A      6/2013

OTHER PUBLICATIONS

Abbas, et al., "Backside illuminated SPAD image sensor with 7.83μm pitch in 3D-stacked CMOS technology," 2016 IEEE International Electron Devices Meeting (IEDM), Dec. 2016, pp. 8.1.1 thru 8.1.4.

(Continued)

*Primary Examiner* — Que Tan Le
(74) *Attorney, Agent, or Firm* — Crowe & Dunlevy (57) ABSTRACT

A photodetection circuit includes a single photon avalanche diode (SPAD) having a cathode coupled to a high voltage supply through a quench resistance and an anode coupled to a first node, a capacitive deep trench isolation capacitor coupled between the first node and ground, and a first n-channel transistor. The first n-channel transistor has a drain coupled to the first node, a source coupled to ground, and a gate coupled to a resistance control signal. A second n-channel transistor has a drain coupled to the first node, a source coupled to ground, and a gate coupled to a second node. An inverter has an input coupled to the first node and an output coupled to an intermediate node. A current starved inverter has an input coupled to the intermediate node and an output coupled to the second node.

16 Claims, 7 Drawing Sheets

(56) References Cited

U.S. PATENT DOCUMENTS

2018/0209846 A1 7/2018 Mandai et al.
2019/0123215 A1 4/2019 Stark
2019/0302242 A1 10/2019 Fenigstein et al.

OTHER PUBLICATIONS

Bronzi, et al: "Fast Sensing and Quenching of CMOS SPADs for Minimal Afterpulsing Effects," IEEE Photonics Technology Letters, vol. 25, No. 8, Apr. 15, 2013, pp. 776 thru 779.
Niclass, et al., "A miniature actively recharged single-photon detector free of afterpulsing effects with 6ns dead time in a 0.18μm CMOS technology," 2010 International Electron Devices Meeting, Dec. 2010, pp. 14.3.1 thru 14.3.4.

\* cited by examiner

PHOTODETECTION CIRCUIT WITH EXTENDED HOLD-OFF TIME FOR SPAD QUENCH ASSISTANCE

RELATED APPLICATION

This application is a continuation-in-part of U.S. patent application Ser. No. 16/711,832, filed Dec. 12, 2019, the contents of which are incorporated by reference.

TECHNICAL FIELD

This application is directed to an active quenching circuit for fully quenching a single photon avalanche diode (SPAD) after an avalanche discharge by sustaining a long hold-off time after quenching, and then rapidly recharging the SPAD to achieve a short dead time.

BACKGROUND

Single photon avalanche diode (SPAD) photodetectors are based on a PN junction that is reverse biased at a voltage exceeding a breakdown voltage. When a photon-generated carrier (via the internal photoelectric effect) is injected into the depletion region of the PN junction, a self-sustaining avalanche is caused, and detection of this avalanche can be used to indicate detection of the photon that generated the carrier. In order to allow the PN junction to be reset so as to detect further photons, the SPAD is quenched, which is to say that the carriers are flushed from the depletion region.

Figure 1A:
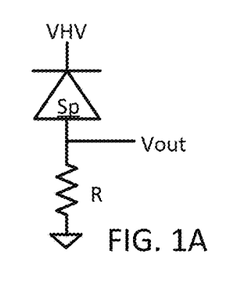
FIG. 1A is a schematic diagram of a prior art SPAD based photodetection circuit.
Figure 1B:
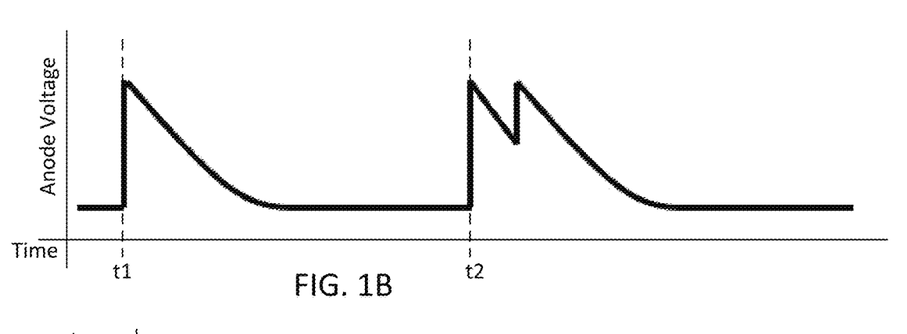
FIG. 1B is a graph of anode voltage of the photodetection circuit of FIG. 1A over time in an ideal case, and in a real-world case where the SPAD is fully depleted.

Such SPADs are utilized in applications such as time of flight (ToF) ranging and light ranging and detection (LIDAR). These applications may utilize fully depleted SPADs due to their suitability for near infrared applications. A sample SPAD circuit is shown in FIG. 1A in which a fully depleted SPAD Sp has its cathode connected to a high voltage VHV and its anode connected to a pull down circuit, which here is a resistor R with a small resistance to help ensure a short deadtime, with signal output being taken at the anode. The anode voltage over time in an ideal case is shown in FIG. 1B with the first spike in the generated output signal occurring at time t1, where a quick rise in the signal is followed by a steady decay. However, fully depleted SPADs suffer from a low quench efficiency, meaning that they suffer from an inability to fully flush charge carriers out of the depletion region. This may result in real world performance similar to the second spike occurring at time t2 as shown in FIG. 1B, where rather than a single peak, dual voltage peaks for the output signal are generated, widening the output pulse from the SPAD, and reducing the rate at which photodetection can be performed.

Figure 1C:
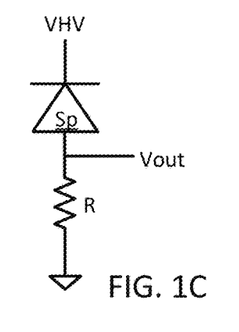
FIG. 1C is a schematic diagram of a first prior art SPAD based photodetection circuit with passive quenching.
Figure 1D:
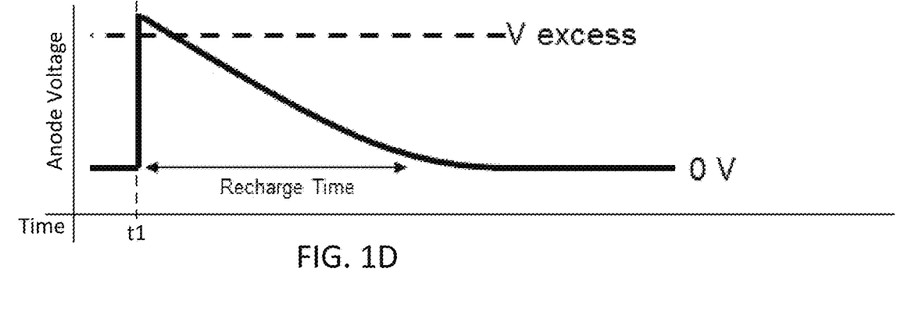
FIG. 1D is a graph of the anode voltage of the photodetection circuit of FIG. 1C over time, showing the increased recharge time over the design of FIG. 1A.

Therefore, passive quenching circuits, with a larger quenching resistor than in FIG. 1A (such as on the order of hundreds of Ohms), have been designed to assist with quenching SPADs. One such circuit is shown in FIG. 1C, where a SPAD Sp has its cathode connected to the high voltage VHV, and its anode connected to ground through a large quench resistor R, with the signal output being taken at the anode of the SPAD Sp. The inclusion of the large quench resistor R increases the recharge time in an attempt to ensure that no charge carriers remain in the depletion region after avalanche. Because of this, the subsequent spike looks like the t1 pulse of FIG. 1D and not the t2 pulse of FIG. 1B.

Figure 1E:
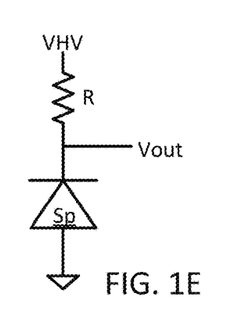
FIG. 1E is a schematic diagram of a second prior art SPAD based photodetection circuit with passive quenching.
Figure 1F:
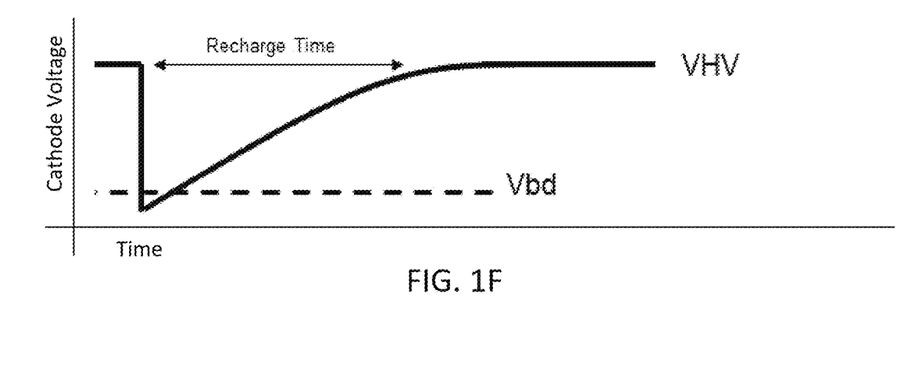
FIG. 1F is a graph of the cathode voltage of the photodetection circuit of FIG. 1E over time, showing the increased recharge time over the design of FIG. 1A.

Another such circuit is shown in FIG. 1E, where a SPAD Sp has its cathode connected to the high voltage VHV through large quench resistor R, and its anode connected to ground, with the signal output being taken at the cathode of the SPAD Sp. As can be seen in FIG. 1F, here the inclusion of the large quench resistor R also increases the recharge time in an attempt to ensure that no charge carriers remain in the depletion region after avalanche.

While these passive quenching circuits may be effective in some scenarios at an expense of very long dead time, in others they may still not be successful in achieving full quench. Therefore, active quenching systems have been developed, such as that described in U.S. Patent Publication No. 2019/0123215 (incorporated by reference). However, such active quenching systems may still not achieve full quench, and may introduce drawbacks such as an increase in dead time (the time period between an avalanche and the SPAD being quenched and ready to avalanche again), which reduces the maximum count rate at which photodetection can be performed.

As such, further improvements in active quench circuits are necessary.

SUMMARY

Described herein is a photodetection circuit, including: a single photon avalanche diode (SPAD) having a cathode coupled to a supply voltage through a quench resistance and an anode coupled to a node; a capacitor coupled between the node and ground; and an active quenching circuit coupled between the node and ground. The active quenching circuit has a variable RC time constant, and is configured to: have a first RC time constant during an idle state so that when the SPAD detects a photon, the SPAD avalanches to begin quenching to set a magnitude of a voltage at the anode of the SPAD to a quench voltage, the quench voltage being greater than a threshold voltage; have a second RC time constant lower than the first RC time constant during a quenching phase during which quenching occurs; have a third RC time constant greater than the second RC time constant but lower than the first RC time constant during a charging phase for the capacitor; have a fourth RC time constant less than the third RC time constant but greater than the second RC time constant during a passive recharge phase during which the SPAD is passively recharged while a voltage between the cathode and anode of the SPAD remains at a constant magnitude; and have a fifth RC time constant less than the first, second, third, and fourth RC time constants during an active recharge phase during which the SPAD is actively recharged and the voltage between the cathode and anode of the SPAD rises.

The active quenching circuit may include a starved delayed buffer.

The starved delayed buffer may include: an inverter having an input coupled to an anode of the SPAD; a starved inverter having an input coupled to an output of the inverter; a transistor circuit coupled between the anode of the SPAD and ground and configured to turn on in response to rising of output of the starved inverter; and a variable resistance circuit coupled between the input of the inverter and ground, and configured to have a variable resistance controlled by a resistance control signal.

The transistor circuit may include a second n-channel transistor having a drain coupled to the input of the inverter, a source coupled to ground, and a gate coupled to the output of the starved inverter.

An enable transistor may be coupled between the anode of the SPAD and the input of the inverter and configured to turn on in response to an enable signal.

The enable transistor may include a third n-channel transistor having a drain coupled to the anode of the SPAD, a source coupled to the input of the inverter, and a gate coupled to the enable signal.

The variable resistance circuit may include a first n-channel transistor having a drain coupled to the input of the inverter, a source coupled to ground, and a gate coupled to the resistance control signal.

The starved inverter may be powered between a current source and ground.

The current source may include a p-channel transistor biased by a tuning voltage.

The SPAD may include a fully depleted SPAD.

The capacitor may include a deep trench isolation capacitor.

Also disclosed herein is a photodetection circuit, including: a single photon avalanche diode (SPAD) having a cathode coupled to a high voltage supply through a quench resistance and an anode coupled to a first node; a capacitive deep trench isolation capacitor coupled between the first node and ground; a first n-channel transistor having a drain coupled to the first node, a source coupled to ground, and a gate coupled to a resistance control signal; a second n-channel transistor having a drain coupled to the first node, a source coupled to ground, and a gate coupled to a second node; an inverter having an input coupled to the first node and an output coupled to an intermediate node; and a current starved inverter having an input coupled to the intermediate node and an output coupled to the second node.

A third n-channel transistor may have a drain directly electrically connected to the anode of the SPAD, a source directly electrically connected to the first node, and a gate coupled to an enable signal.

The inverter may include: a first p-channel transistor having a source coupled to a supply voltage, a drain coupled to the intermediate node, and a gate coupled to the first node; and a fourth n-channel transistor having a drain coupled to the intermediate node, a source coupled to ground, and a gate coupled to the first node.

The current starved inverter may include: a second p-channel transistor having a source coupled to a supply voltage, a drain, and a gate coupled to a tuning voltage; a third p-channel transistor having a source coupled to the drain of the second p-channel transistor, a drain coupled to the second node, and a gate coupled to the intermediate node; and a fifth n-channel transistor having a drain coupled to the second node, a source coupled to ground, and a gate coupled to the intermediate node.

A clamp diode may have a cathode coupled to a SPAD turn-off signal and an anode coupled to the anode of the SPAD.

DETAILED DESCRIPTION

The following disclosure enables a person skilled in the art to make and use the subject matter disclosed herein. The general principles described herein may be applied to embodiments and applications other than those detailed above without departing from the spirit and scope of this disclosure. This disclosure is not intended to be limited to the embodiments shown, but is to be accorded the widest scope consistent with the principles and features disclosed or suggested herein.

Figure 2:
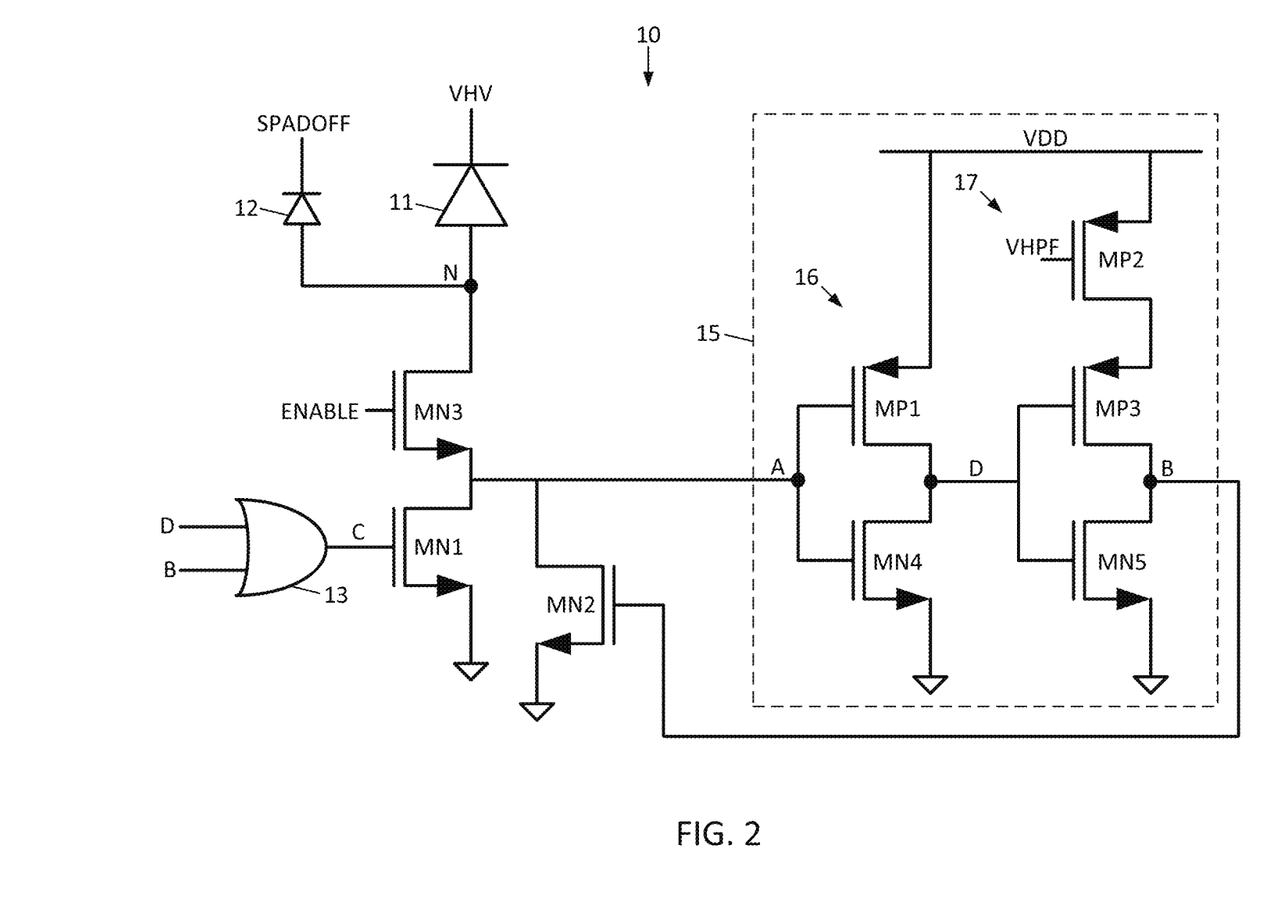
FIG. 2 is a schematic diagram of a SPAD based photodetection circuit disclosed herein which fully quenches the SPAD.

A photodetection circuit 10 with active quenching includes a fully depleted single photon avalanche diode (SPAD) 11 having a cathode connected to a high voltage VHV and an anode connected to node N. A clamp diode 12 has a cathode connected to receive a SPAD turnoff signal SPADOFF and an anode connected to node N.

An n-channel transistor MN3 has its drain connected to node N, its source connected to node A, and its gate connected to receive the enable signal ENABLE. An n-channel transistor MN1 has its drain connected to node A, its source connected to ground, and its gate connected to the output of logic-OR gate 13 at node C. An n-channel transistor MN2 has its drain connected to node A, its source connected to ground, and its gate connected to node B. The logic-OR gate 13 has inputs coupled to node D and node B, and its output coupled to node C.

A starved delayed buffer 15 is connected between nodes A and B, and is comprised of an inverter 16 having its input connected to node A and its output connected to node D, and a starved inverter 17 having its input connected to node D and an output connected to node B. The inverter 16 is comprised of: p-channel transistor MP1 having its source connected to a supply voltage VDD, its drain connected to the node D, and its gate connected to node A; and n-channel transistor MN4 having its drain connected to the node D, its source connected to ground, and its gate connected to node A. The starved inverter 17 is comprised of: p-channel transistor MP2 having its source connected to the supply voltage VDD, its drain connected to the source of p-channel transistor MP3, and its gate connected to receive the bias voltage VHPF; p-channel transistor MP3 having its source connected to the drain of p-channel transistor MP2, its drain connected to node B, and its gate connected to the node D; and n-channel transistor MN5 having its drain connected to node B, its source connected to ground, and its gate connected to the node D.

The photodetection circuit 10 is enabled by the ENABLE signal being at a logic high to turn on transistor MN3. In operation, the photodetection circuit 10 alternates the RC time constant at the anode of the SPAD 11 between a first RC value (a very low RC value with enough quenching resistance that is set by the W/L ratio of transistor MN1 and transistor MN3) during quench, a second RC value (a very high RC value) during hold-off, and a third RC value (a low RC value during recharge, higher than the very low RC value during quench, lower than the very high RC value during hold-off, such that the third RC value is greater than the first RC value but less than the second RC value).

Figure 3A:
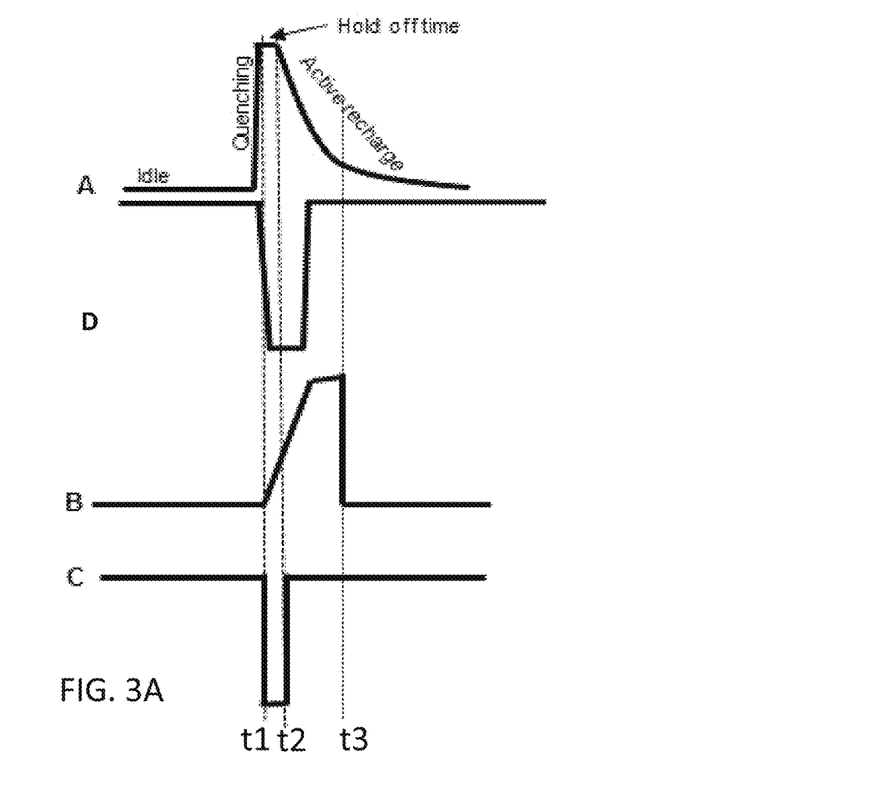
FIG. 3A is a graph showing voltages at nodes A, B, and C of the photodetection circuit of FIG. 2 in operation.
Figure 3B:
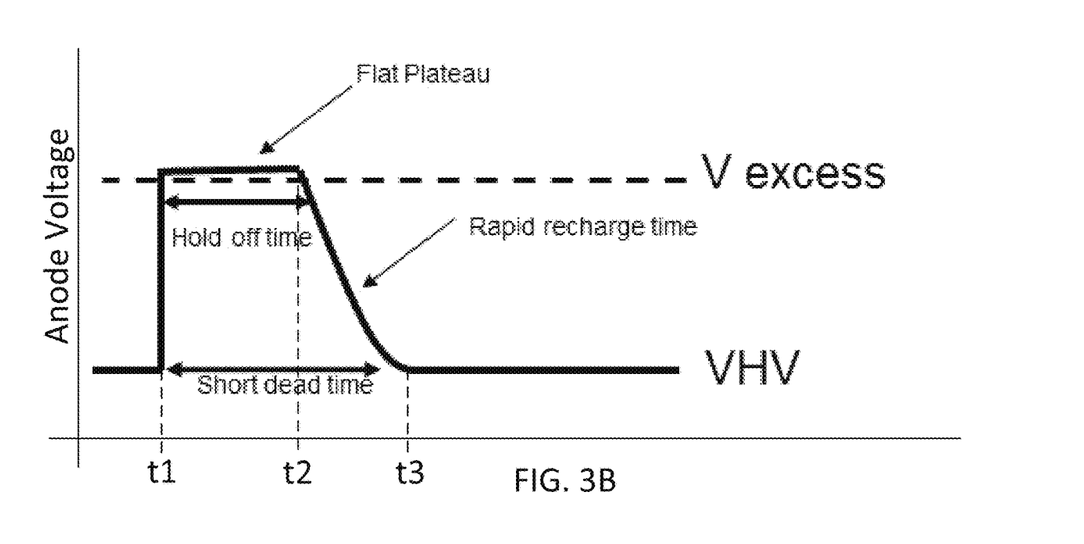
FIG. 3B is a graph showing the voltage at the anode of the SPAD of the photodetection circuit of FIG. 2 in operation.

In detail, with additional reference to FIGS. 3A-3B, when a photon is detected by the SPAD 11, a rising edge of the SPAD output signal at node A quickly occurs at time t1 because the RC time constant at this point is very low. Once the rising edge reaches the threshold value of the inverter 16, a falling edge will appear at the node D. Keep in mind that the inverter 17 is starved of current because the bias voltage VHPF is set at a level which constrains the current through transistor MP2, and therefore the available current at the source of transistor MP3 is limited, causing the inverter 17 to have a slow response time to pull its output high.

While the falling edge at the node D triggers the starved inverter 17, as explained, the fact that the inverter 17 is starved of current means that its output at node B rises slowly, as can be seen between times t1 and t2. Therefore, at the occurrence of the falling edge at the node D, the falling edge at the node D and the low voltage at node B cause the output of the logic-OR gate 13 to go low between times t1 and t2, turning off transistor MN1, forcing the RC time constant high and maintaining the anode voltage of the SPAD 11 nearly constant, forming a nearly flat voltage plateau for a long hold off time. Once the voltage at node B rises to the threshold level of the logic-OR gate 13 at time t2, node C will rise high, turning on transistor MN1 fully. The fact that node B is at the threshold level of logic-OR gate 13 (but has not reached its maximum) at t2 turns transistor MN2 on but in linear mode (not saturation, so that it is not fully turned on) so that it acts as a resistor with a low resistance. This lowers the RC time constant to lower than it was between times t1 and t2, but higher than it was prior to time t1, forming a low impedance path for rapid recharge of the SPAD 11, achieving a short dead time despite the long hold off time. This provides for the ability to fully quench the SPAD 11 while maintaining a short dead time, thereby allowing for a rapid photodetection rate.

In the above description, when referring to the RC time constant, C is the internal capacitance of the SPAD 11, while R is the total resistance formed by the on resistances of the series connected source-drain paths of the transistors MN1 and MN3. Depending on the biasing condition of transistor MN1, the total resistance R changes, and therefore the RC time constant changes.

Figure 4:
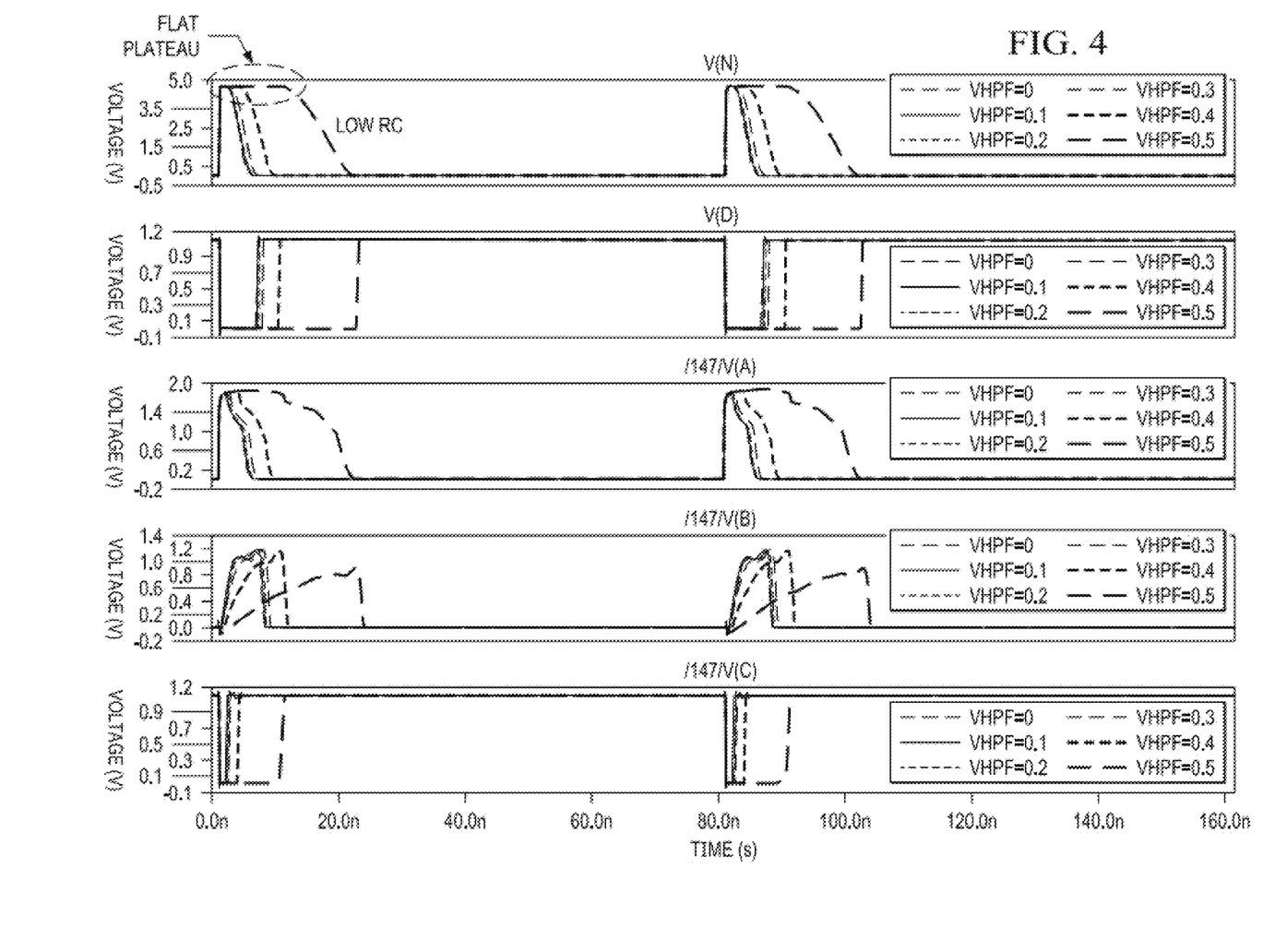
FIG. 4 is a graph showing the effect of different values of VHPF (different levels of current starvation of the starved inverter of FIG. 2) on the anode voltage of the SPAD, as well as the voltages at nodes A, B, and C.

Note that bias voltage VHPF can be tuned so as to tune the magnitude of current provided to transistor MP3 (e.g., tune the level of current starvation of the starved inverter 17), which enables the tuning of the length of the hold off time, therefore allowing adaption of the photodetection circuit 10 to match variations in SPADs. As the bias voltage VHPF increases, the rise time of the voltage at node B increases, increasing the RC time constant and therefore increasing the hold off time; conversely, as bias voltage VHPF decreases, the rise time of the voltage at node B decreases, decreasing the RC time constant and therefore decreasing the hold off time. This can be seen in FIG. 4, for example, where, for example, a bias voltage VHPF of 0 V or 0.1 V provides for a short hold off time, but a bias voltage VHPF of 0.5 V provides for a long hold off time.

Figure 5:
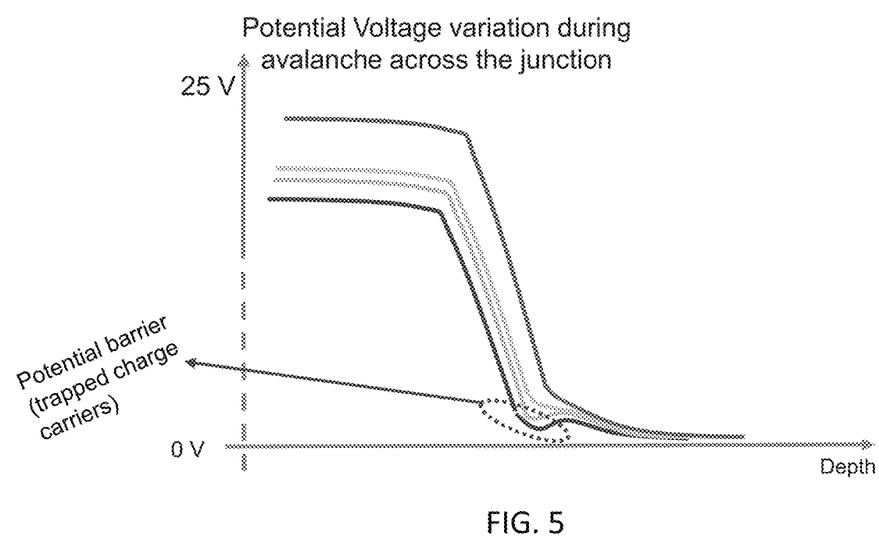
FIG. 5 is a graph showing the potential voltage variation across the SPAD of the circuit of FIG. 2 during avalanche.

While the design of FIG. 2 is highly effective, there is the possibility for charge carriers to become trapped within a pocket of potential barrier in the depletion region between the N+ region and P-Well forming the P-N junction of the SPAD. The effect of these trapped charge carriers can be seen in FIG. 5.

Figure 6:
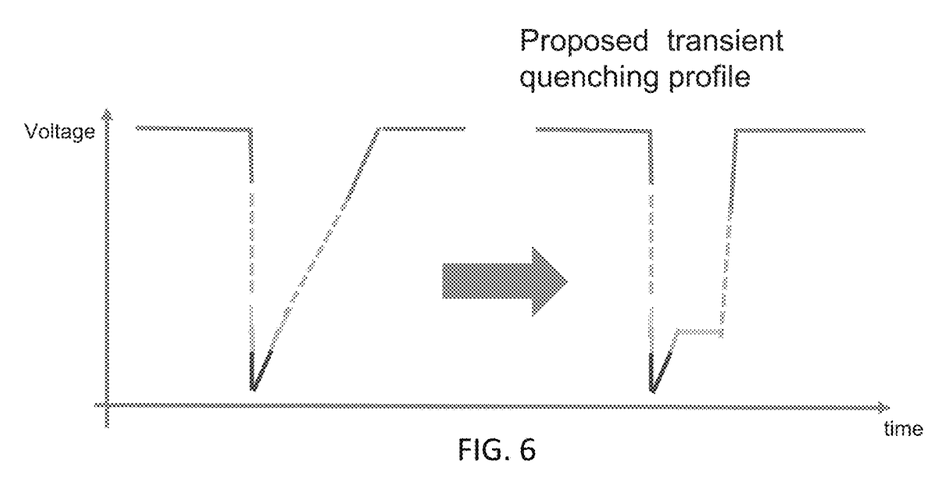
FIG. 6 is a graph showing the transient quenching profile of the voltage across the SPAD of FIG. 2 after a detection event, and showing a proposed transient quenching profile that would be even more advantageous.

One way to modify the design of FIG. 2 to eliminate this issue and evacuate the trapped charge carriers within the potential barrier is to add cathode-side quenching to the design to help fully flush the depletion region of charge carriers. A conventional quenching profile for one sided (i.e., cathode-side) quenching can be seen in FIG. 6. However, this quenching profile may not permit sufficient time for full charge carrier evacuation, which can lead to undesirable after pulses. Therefore, it is would be desirable to modify this quenching profile such that the voltage across the junction is maintained at a plateau for a sufficient period of time at a certain recharge point where the potential barrier is starting to relax (orange line FIG. 5) to allow the depletion region to be fully flushed of charge carriers, as also shown in FIG. 6.

Figure 7:
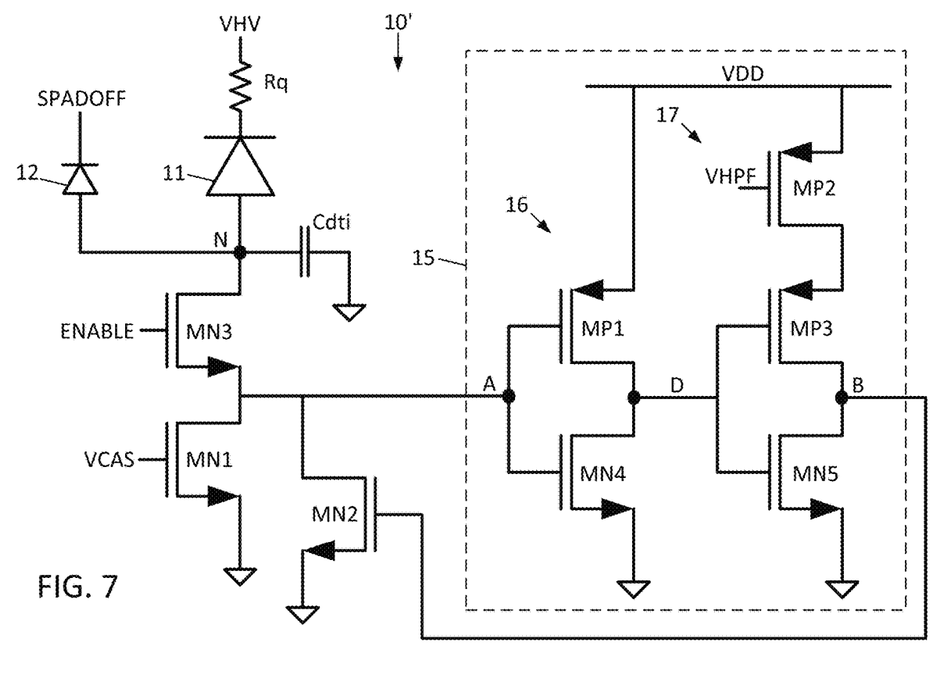
FIG. 7 is a schematic diagram of a SPAD based photodetection circuit disclosed herein which utilizes the transient quenching profile shown in FIG. 6.

To accomplish this, a photodetection circuit 10' employing cathode-side quenching, but with anode-side pulldown assist and sensing, has been developed.

The photodetection circuit 10' includes a fully depleted single photon avalanche diode (SPAD) 11 having a cathode connected to a high voltage VHV through a quench resistance Rq and an anode connected to node N. A clamp diode 12 has a cathode connected to a SPAD turnoff signal SPADOFF and an anode connected to node N. A capacitor Cdti formed, for example, from a capacitive deep trench isolation is connected between node N and ground.

An n-channel transistor MN3 has its drain connected to node N, its source connected to node A, and its gate connected to the enable signal ENABLE. An n-channel transistor MN1 has its drain connected to node A, its source connected to ground, and its gate connected to a cascode control signal Vcas. An n-channel transistor MN2 has its drain connected to node A, its source connected to ground, and its gate connected to node B.

A starved delayed buffer 15 is connected between nodes A and B, and is comprised of an inverter 16 having its input connected to node A and its output connected to node D, and a starved inverter 17 having its input connected to node D and an output connected to node B.

The inverter 16 is comprised of: p-channel transistor MP1 having its source connected to a supply voltage VDD, its drain connected to the node D, and its gate connected to node A; and n-channel transistor MN4 having its drain connected to the node D, its source connected to ground, and its gate connected to node A.

The starved inverter 17 is comprised of: p-channel transistor MP2 having its source connected to the supply voltage VDD, its drain connected to the source of p-channel transistor MP3, and its gate connected to the bias voltage VHPF; p-channel transistor MP3 having its source connected to the drain of p-channel transistor MP2, its drain connected to node B, and its gate connected to the node D; and n-channel transistor MN5 having its drain connected to node B, its source connected to ground, and its gate connected to the node D.

Figure 8:
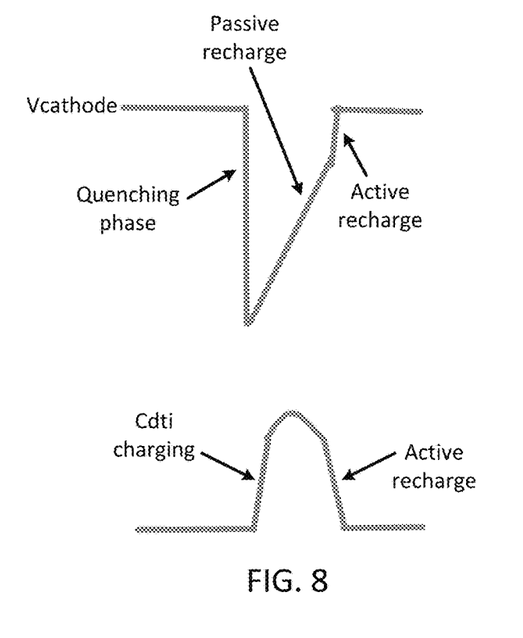
FIG. 8 is a graph showing the cathode voltage and anode voltage of the SPAD of the photodetection circuit of FIG. 7 during quenching and recharge.

The photodetection circuit 10' is enabled by the ENABLE signal being at a logic high to turn on MN3. In operation, when a photon strikes the SPAD 11, an avalanche within the p-n junction of the SPAD 11 results, and a rush of current flows from VHV into the quench resistor Rq, through the quench resistor Rq, into the cathode of the SPAD 11, and out the anode of the SPAD 11. This results in a rapid drop of the voltage at the cathode of the SPAD 11, quenching the SPAD 11, as can be seen in FIG. 8. The RC time constant at the anode of the SPAD 11 is, during quenching, very low, as it is equal to the junction resistance of the SPAD 11 multiplied by the junction capacitance of the SPAD 11.

Due to the large capacitance (e.g., ~30 fF) of the capacitor Cdti and the high resistance of MN1 (set by the cascode control signal Vcas placing the transistor MN1 into the linear region of operation), the anode of the SPAD 11 reacts to the avalanche current more slowly than the cathode, and therefore the capacitor Cdti begins to charge, and the voltage at node A begins to rise, once the cathode is already recharging, as can also be seen in FIG. 8. Since the inverter 16 is not starved like the inverter 17, node D will quickly fall low. At this point in operation, the RC time constant at the anode of the SPAD 11 is high, as it is equal to the resistance across MN1 (which is high as it is in the linear region of operation) in parallel with the high drain to source resistance of the n-channel transistor MN2 (which is off at this point) and junction resistance of the SPAD 11 (which is increasing at this point), multiplied by the junction capacitance of the SPAD 11.

Figure 9:
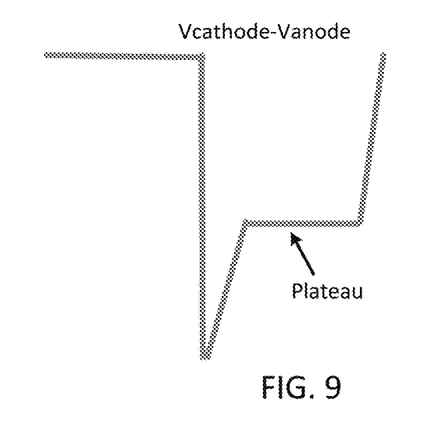
FIG. 9 is a graph showing the voltage across the SPAD of the photodetection circuit of FIG. 7 during quenching and recharge.
Figure 10:
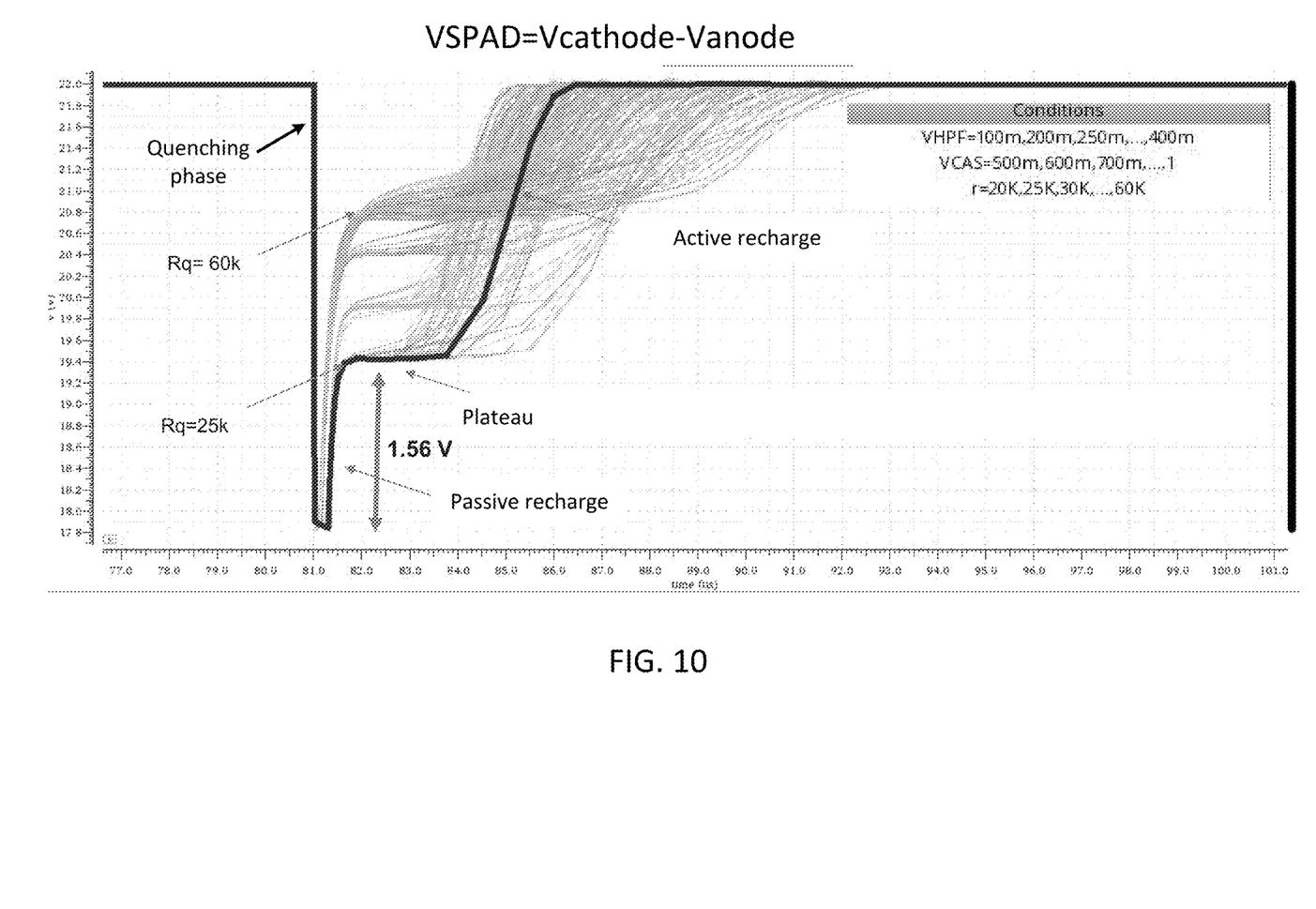
FIG. 10 is a graph showing the voltage across the SPAD of the photodetection circuit of FIG. 7 during quenching and recharge, for different values of the quench resistance.

The voltage difference between the recharge voltage response at the cathode and the slower rising voltage at the anode creates a voltage profile across the SPAD 11 (so, Vspad=Vcathode-Vanode) with a plateau as illustrated in FIGS. 9-10. The magnitude at which the plateau occurs is determined by the length of time taken for capacitor Cdti to charge (which is a function of voltage of the cascode control signal Vcas), and the hold-off time of the plateau (duration of the plateau) is determined by the amount of current sourced from the p-channel transistor MP2 to the p-channel transistor MP3. Therefore, the hold-off time of the plateau is set as a function of the bias voltage VHPF. During this plateau, passive recharge of the SPAD 11 occurs, and the RC time constant at the anode of the SPAD 11 is likewise high, here being equal to the resistance of Rq added to the junction resistance of the SPAD 11, multiplied by the junction capacitance of the SPAD 11.

Once sufficient current has been sourced to the p-channel transistor MP3 for the output of the inverter 17 to go to a logic high and turn on n-channel transistor MN2, the total resistance seen by the anode of the SPAD 11 drops, with the result is that capacitor Cdti charges more quickly, entering the so-called active recharge phase, resulting in a shorter dead time. At this point, the RC time constant at the anode of the SPAD 11 drops back low, being equal to the resistance across MN1 in parallel with the on-resistance across the MN2 and the junction capacitance of the SPAD 11, multiplied by the capacitance of capacitor Cdti. Due to the extremely low on-resistance of MN2 (since it will be on and in the saturation region), the overall RC time constant is low.

The effect of the value of the quench resistance Rq on the voltage across the SPAD 11 during quenching can be seen in FIG. 10, where the quench profile is shown for different resistance values of Rq.

While the disclosure has been described with respect to a limited number of embodiments, those skilled in the art, having benefit of this disclosure, will appreciate that other embodiments can be envisioned that do not depart from the scope of the disclosure as disclosed herein. Accordingly, the scope of the disclosure shall be limited only by the attached claims.

The invention claimed is:

1. A photodetection circuit, comprising:
a single photon avalanche diode (SPAD) having a cathode coupled to a supply voltage through a quench resistance, and an anode coupled to a node;
a capacitor coupled between the node and ground; and
an active quenching circuit coupled between the node and ground, the active quenching circuit having a variable RC time constant, the active quenching circuit configured to:
have a first RC time constant during an idle state so that when the SPAD detects a photon, the SPAD avalanches to begin quenching to set a magnitude of a voltage at the anode of the SPAD to a quench voltage, the quench voltage being greater than a threshold voltage;
have a second RC time constant lower than the first RC time constant during a quenching phase during which quenching occurs;
have a third RC time constant greater than the second RC time constant but lower than the first RC time constant during a charging phase for the capacitor;
have a fourth RC time constant less than the third RC time constant but greater than the second RC time constant during a passive recharge phase during which the SPAD is passively recharged while a voltage between the cathode and the anode of the SPAD remains at a constant magnitude; and
have a fifth RC time constant less than the first, second, third, and fourth RC time constants during an active recharge phase during which the SPAD is actively recharged and the voltage between the cathode and the anode of the SPAD rises.

2. The photodetection circuit of claim 1, wherein the active quenching circuit comprises a starved delayed buffer.

3. The photodetection circuit of claim 2, wherein the starved delayed buffer comprises:
an inverter having an input coupled to the anode of the SPAD;
a starved inverter having an input coupled to an output of the inverter;
a transistor circuit coupled between the anode of the SPAD and ground and configured to turn on in response to rising of output of the starved inverter; and
a variable resistance circuit coupled between the input of the inverter and ground, and configured to have a variable resistance controlled by a resistance control signal.

4. The photodetection circuit of claim 3, wherein the transistor circuit comprises:
a second n-channel transistor having a drain coupled to the input of the inverter, a source coupled to ground, and a gate coupled to the output of the starved inverter.

5. The photodetection circuit of claim 4, further comprising:
an enable transistor coupled between the anode of the SPAD and the input of the inverter, wherein the enable transistor is configured to turn on in response to an enable signal.

6. The photodetection circuit of claim 5, wherein the enable transistor comprises:
a third n-channel transistor having a drain coupled to the anode of the SPAD, a source coupled to the input of the inverter, and a gate coupled to receive the enable signal.

7. The photodetection circuit of claim 5, wherein the variable resistance circuit comprises:
a first n-channel transistor having a drain coupled to the input of the inverter, a source coupled to ground, and a gate coupled to receive the resistance control signal.

8. The photodetection circuit of claim 3, wherein the starved inverter is powered between a current source and ground.

9. The photodetection circuit of claim 8, wherein the current source comprises a p-channel transistor biased by a tuning voltage.

10. The photodetection circuit of claim 1, wherein the SPAD comprises a fully depleted SPAD.

11. The photodetection circuit of claim 1, wherein the capacitor comprises a deep trench isolation capacitor.

12. A photodetection circuit, comprising:
a single photon avalanche diode (SPAD) having a cathode coupled to a high voltage supply through a quench resistance and an anode coupled to a first node;
a capacitive deep trench isolation capacitor coupled between the first node and ground;
a first n-channel transistor having a drain coupled to the first node, a source coupled to ground, and a gate coupled to receive a resistance control signal;
a second n-channel transistor having a drain coupled to the first node, a source coupled to ground, and a gate coupled to a second node;
an inverter having an input coupled to the first node and an output coupled to an intermediate node; and
a current starved inverter having an input coupled to the intermediate node and an output coupled to the second node.

13. The photodetection circuit of claim 12, further comprising a third n-channel transistor having a drain directly electrically connected to the anode of the SPAD, a source directly electrically connected to the first node, and a gate coupled to receive an enable signal.

14. The photodetection circuit of claim 12, wherein the inverter comprises:
a first p-channel transistor having a source coupled to a supply voltage, a drain coupled to the intermediate node, and a gate coupled to the first node; and
a fourth n-channel transistor having a drain coupled to the intermediate node, a source coupled to ground, and a gate coupled to the first node.

15. The photodetection circuit of claim 12, wherein the current starved inverter comprises:
a second p-channel transistor having a source coupled to a supply voltage, a drain, and a gate coupled to receive a tuning voltage;
a third p-channel transistor having a source coupled to the drain of the second p-channel transistor, a drain coupled to the second node, and a gate coupled to the intermediate node; and
a fifth n-channel transistor having a drain coupled to the second node, a source coupled to ground, and a gate coupled to the intermediate node.

16. The photodetection circuit of claim 12, further comprising a clamp diode having a cathode coupled to a SPAD turn-off signal and an anode coupled to the anode of the SPAD.

* * * * *